(12) United States Patent
Nahas et al.

(10) Patent No.: US 7,543,211 B2
(45) Date of Patent: Jun. 2, 2009

(54) TOGGLE MEMORY BURST

(75) Inventors: Joseph J. Nahas, Austin, TX (US);
Thomas W. Andre, Austin, TX (US);
Chitra K. Subramanian, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 814 days.

(21) Appl. No.: 11/047,544

(22) Filed: Jan. 31, 2005

(65) Prior Publication Data

US 2006/0174172 A1 Aug. 3, 2006

(51) Int. Cl.
*H03M 13/00* (2006.01)
(52) U.S. Cl. .................. 714/752; 714/757; 714/718; 714/763; 356/145
(58) Field of Classification Search .............. 714/752, 714/718, 763, 48; 365/712, 171, 158, 130, 365/145; 711/105
See application file for complete search history.

(56) References Cited

U.S. PATENT DOCUMENTS 6,188,615 B1 * 2/2001 Perner et al. ........... 365/189.01
6,272,041 B1 * 8/2001 Naji ........................ 365/171
6,418,046 B1 * 7/2002 Naji ........................ 365/158
6,529,993 B1 * 3/2003 Rogers et al. ............ 711/105
6,545,906 B1   4/2003 Savtchenko
6,667,899 B1 * 12/2003 Subramanian et al. ...... 365/158
6,693,824 B2   2/2004 Nahas et al.
6,937,497 B1 * 8/2005 Ju et al. ................... 365/130

* cited by examiner

*Primary Examiner*—Jacques Louis-Jacques
*Assistant Examiner*—Fritz Alphonse
(74) *Attorney, Agent, or Firm*—Ingrassia Fisher & Lorenz, P.C.

(57) ABSTRACT

A controller for a toggle memory that performs burst writes by reading a group of bits in the toggle memory and comparing each received data word of the burst with a portion of the group to determine which cells to toggle to enter the data of the burst write in the toggle memory. In one example the toggle memory includes magnetoresistive random access memory (MRAM) with cells using multiple free magnetic layers that toggle between states when subjected to a sequence of magnetic pulses along two directions. Because one read is performed for a group of data of the burst, the time needed to perform the burst write is reduced.

22 Claims, 2 Drawing Sheets

TOGGLE MEMORY BURST

BACKGROUND OF THE INVENTION

1. Field of the Invention

This invention relates in general to toggle memories and specifically to writing to toggle memories.

2. Description of the Related Art

A memory cell is a storage unit of a memory that stores a bit of data. Toggle memories are memories having storage cells whose logic state is written by toggling the state stored in the cell from either a first state to a second state or from the second state to the first state. With toggle memories, if a particular logic state is desired to be stored in a cell, the present state of the cell is first read to determine whether the present state matches the desired state. If the present state does not match the desired state, then the cell is toggled to change the state to match the desired state. If the present state matches the desired state, then the cell is not toggled. Accordingly, each write cycle of a toggle memory cell requires a read of that cell.

One type of toggle memory is a type of magnetoresistive random access memory (MRAM) that includes cells using multiple free magnetic layers that toggle between states when subjected to a sequence of magnetic pulses along two directions. One example of such a memory is set forth in U.S. Pat. No. 6,545,906, which is hereby incorporated by reference in its entirety.

With some types of MRAM cells, the state of the cell is differentiated by the resistance of the magnetic tunnel junction of the cell. In a first state, the resistance is relatively low. In a second state, the resistance is relatively high. Because reading a cell requires a differentiation of resistance values, reading a cell can be relatively slow as compared to the toggling operation.

What is needed is an improved method for writing values to an toggle memory.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

Figure 1:
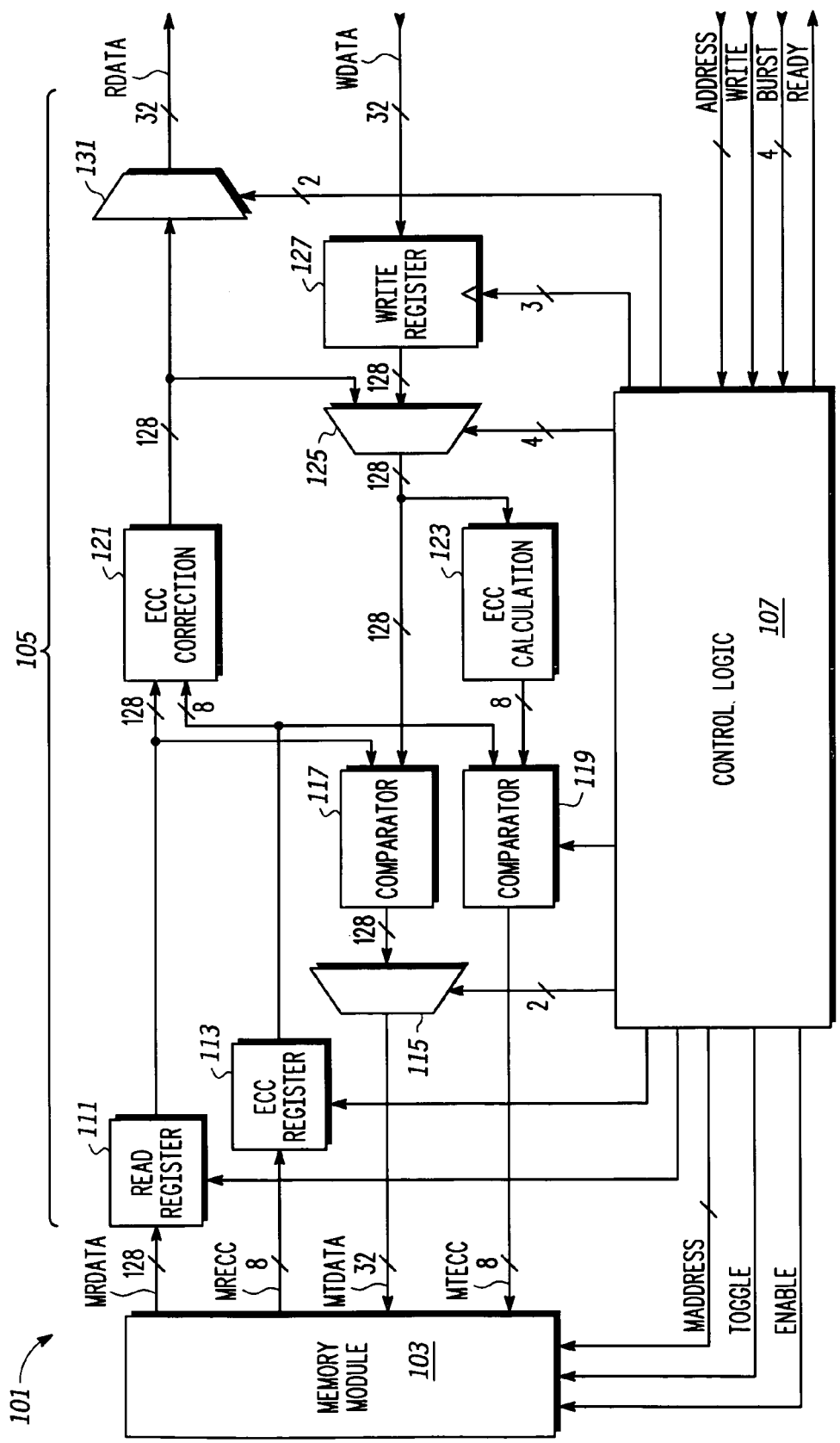
FIG. 1 is a block diagram of one embodiment of a toggle memory system according to the present invention.

FIG. 1 is a block diagram of a toggle memory system according to the present invention. In the embodiment shown, memory system 101 includes a memory module 103 and control circuitry 105 for controlling data reads and data writes to memory module 103. In one embodiment, memory module 103 includes at least one array of MRAM memory cells each having multiple free magnetic layers that toggle between states when subjected to a sequence of magnetic pulses along two directions. However, in other embodiments, module 103 may include one or more arrays of other types of toggle memory cells including e.g. other types of MRAM cells. Memory module 103 also includes sense amplifiers, column and row selection logic, write drivers, and timing logic.

Control circuitry 105 includes circuitry for performing data reads and data writes to memory module 103 e.g. that are initiated by a processor (not shown) via a system bus (e.g. a computer system bus). In the embodiment shown, the system bus includes address signals (ADDRESS), control signals (WRITE, BURST, and READY), and data signals (RDATA and WDATA). In some embodiments, the same data signal lines of a system bus would carry both the RDATA and WDATA signals. Also, the signal bus may include other control signals not disclosed e.g. clock, select, sequential address, data size, and controller response signals. In one embodiment, the system bus conforms to an ADVANCED HIGH-PERFORMANCE BUS SPECIFICATION, a part of the AMBA SPECIFICATION by ARM LIMITED of the United Kingdom.

In one embodiment, module 103 and control circuitry 105 may be implemented on the same integrated circuit. In other embodiments, they may be implemented on different integrated circuits. In some embodiments, system 101 is implemented on the same integrated circuit as the processor and system bus. In other embodiments, they may be implemented on separate integrated circuits.

Control circuitry 105 includes read register 111, error correcting code (ECC) register 113, multiplexer 115, comparators 117 and 119, ECC correction circuit 121, ECC calculation circuit 123, multiplexers 125 and 131, write register 127, and control logic 107. The circuits of circuitry 105 include clock inputs (not shown) in FIG. 1. In one embodiment, comparator 117 is implemented with 128 XOR circuits and comparator 119 is implemented with 8 XOR circuits.

Circuitry 105 includes lines for receiving data signals (MRDATA) and error correction data signals (MRECC) from module 103. Circuitry 105 includes signal lines for providing data toggle instructions (MTDATA and MTECC) to module 103 to toggle the states of cells of module 103 to store both desired data and error correction codes, respectively. Circuitry 105 also includes lines for providing address signals (MADDRESS), a toggle control signal (TOGGLE), and an enable signal (ENABLE) to module 103.

Circuitry 105 includes circuitry for enabling burst writes to memory module 103. In response to receiving a command via the BURST and WRITE signals, control logic 107, via control signals to register 127, positions the data carried by the WDATA signals in write register 127 in one of four locations, depending upon its address. In the example shown, the WDATA signals are 32 bits wide (a 32 bit word) and write register 127 is 128 bits wide for storing four 32 bit words (128 bits) per data transfer burst. In other embodiments, the data signals may have other widths. Also in other embodiments, the burst may have other lengths (e.g. other than four as with the embodiment shown). In other embodiments, write register 127 may be of other sizes (other than four 32 bit words) to accommodate write bursts of other lengths.

Control circuitry 105 includes circuitry for deriving error correction solutions for the data being stored in memory module 103 for both burst writes and single writes. Multiplexer 125 is controlled by control logic 107 to provide 32 bits from register 127 and 96 bits from ECC correction circuit 121 for a single write. The bits provided by circuit 121 are error corrected data from a read of 128 bits of memory module 103 that include the 32 bits from the desired cells in which the data is be written. The read data is error corrected with an 8 bit error correction code read from an 8 bit location corresponding to the 128 bit location whose data was supplied to ECC correction circuit 121 via read register 111. The error correction code is supplied to the ECC correction circuit 121 via ECC register 113.

During a single write, the 32 bit word to be written into module 103 is combined with 96 bits from ECC correction circuit 121 and is provided to comparator 117 wherein the combined 128 bits are compared with the 128 bits stored in read register 111. Control logic 107 then selects, with multiplexer 115, which 32 bit word from comparator 117 is to be provided to module 103 as toggle instructions for toggling the 32 cells as needed at the location designed by MADDRESS. In one embodiment, a one at a location of a toggle instruction causes the cell of module 103 corresponding to that location to be toggled wherein a zero at a location of a toggle instruction causes the cell of module 103 corresponding to that location not be toggled. Also, the 128 combined bits are provided to ECC calculation circuit 123 to generate an 8 bit error correction code for the 128 bits. The 8 bit output of circuit 123 is then compared (by comparator 119) to the 8 bit error correction code in register 113 to generate toggle data for the 8 cells of module 103 that corresponds to MADRRESS. In other embodiments, circuitry 105 may include other circuitry for performing a single write and/or may perform a single write by different techniques.

Circuitry 105 also includes circuitry for performing burst writes of data including circuitry for deriving error correction solutions for the data of the burst write.

Figure 2:
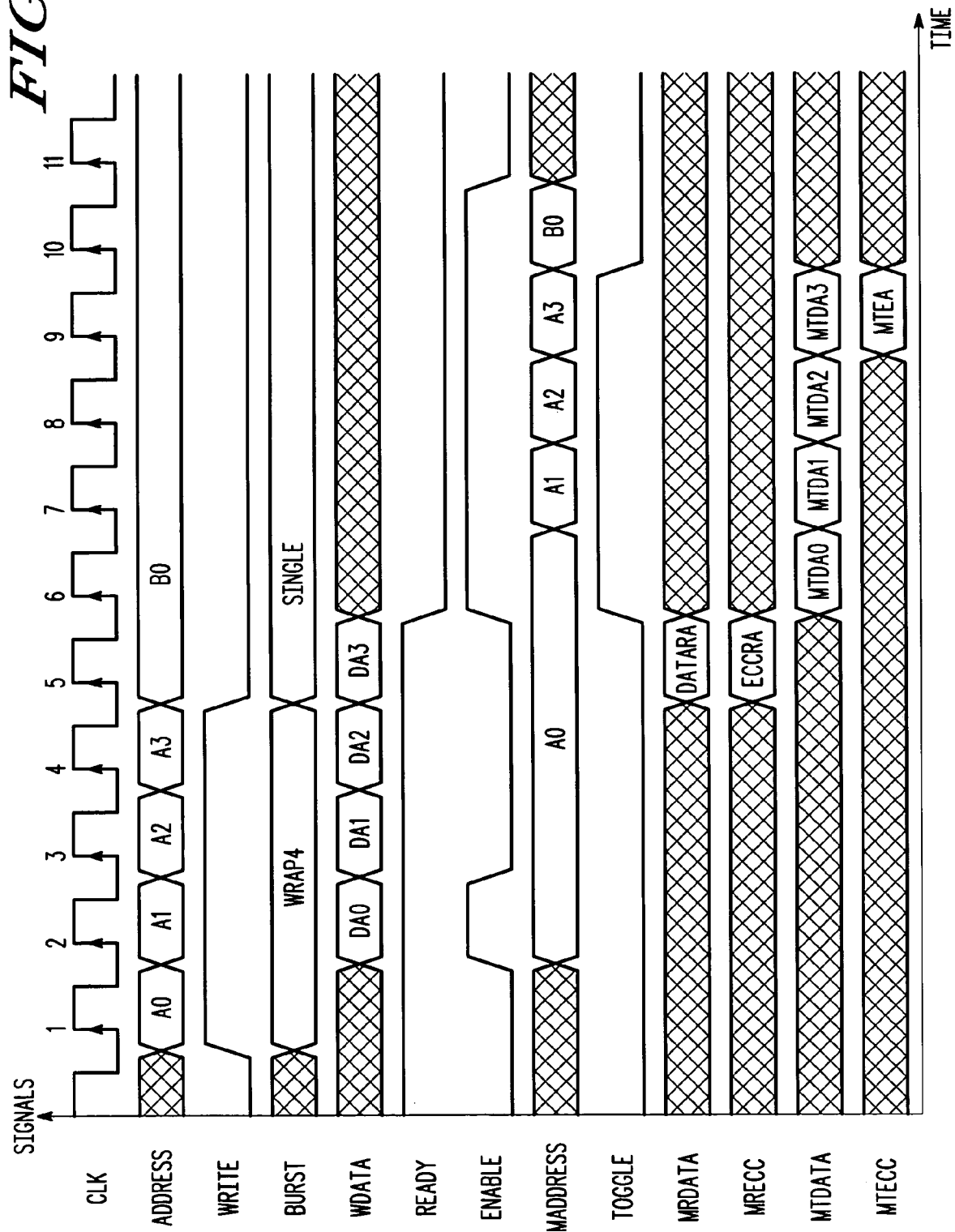
FIG. 2 is a timing diagram of one embodiment of a burst write of the system shown in FIG. 1 according to the present invention.

FIG. 2 is a timing diagram of one embodiment for performing a burst write by memory system 101. In the embodiment shown, a command for a burst write is received from a processor via the system bus by a combination of the WRITE signal being high, a WRAP4 command being supplied by the BURST signals, a select signal (not shown) being high, and a valid address being provided by the ADDRESS signals at CLK signal rising edge 1 (indicated by a 1 in FIG. 2). In the embodiment shown, a four word burst is indicated as opposed to a single word write due to the WRAP4 command being supplied by the BURST signals as opposed to the BURST signals indicating a single write. In the embodiment shown, the WRAP4 command indicates that the burst is to be a wrap burst wherein all of the four 32 bit words are to be written to the 128 cells of module 103 having the same most significant address bits. In other embodiments, circuitry 105 can implement other types of burst including e.g. a two 32 bit word burst and an eight 32 bit word burst wherein the BURST signals would indicate such. Still in other embodiments, other types of bursts may be implemented.

In the embodiment shown, the first 32 bit word (DA0) of the burst is carried by the WDATA signals at CLK signal rising edge 2, the second 32 bit word (DA1) of the burst is carried by the WDATA signals at CLK signal rising edge 3, the third 32 bit word (DA2) of the burst is carried by the WDATA signals at CLK signal rising edge 4, and fourth 32 bit word (DA3) of the burst is carried by the WDATA signals at CLK signal rising edge 5. The addresses of the four designated 32 bit locations (A0, A1, A2, and A3) are given by the signals of the ADDRESS signals transmitted at CLK signal rising edges 1, 2, 3, and 4 respectively.

Shown in FIG. 2, a subsequent single read request of address B0 is received by circuitry 105 at CLK signal rising edge 5. Because, control circuitry 105 can not respond to the read in the next cycle, control logic 107 de-asserts the READY signal in cycle 6 (the cycle including CLK signal rising edge 6).

In response to receiving a write request, control logic 107 initiates at CLK signal rising edge 2 a read request to the module 103 by asserting the ENABLE signal and supplying the address A0 with the MADDRESS signals. Referring back to FIG. 1, module 103 returns the requested read data via signals MRDATA and corresponding error correction code via signals MRECC at CLK signal rising edge 5 to read register 111 and ECC register 113, respectively.

When the first 32 bit word (DA0) is received, it is written into a 32 bit word location (as determined by the least significant bits of address A0) of write register 127 at CLK signal rising edge 2. When the second 32 bit word (DA1) is received, it is written into a 32 bit word location (as determined by the least significant bits of address A1) of write register 127 at CLK signal rising edge 3. When the third 32 bit word (DA2) is received, it is written into a 32 bit word location (as determined by the least significant bits of address A2) of write register 127 at CLK signal rising edge 4. When the fourth 32 bit word (DA3) is received, it is written into a 32 bit word location (as determined by the least significant bits of address A3) of write register 127 at CLK signal rising edge 5.

In the embodiment shown, an updated error correction code is generated by ECC calculation circuit 123 for each 32 bit data word received. However, in the embodiment described (as will be explained later), only error correction code corresponding to the last 32 bit data word (DA3), and which is based on the data of all four data words (DA0, DA1, DA2, and DA3) is entered into module 103 via the enabling of comparator 119 by control logic 107.

In the embodiment shown, multiplexer 125 passes the four words DA0, DA1, DA2, and DA3 to comparator 117 and ECC calculation circuit 123. Comparator 117 compares the 128 bits with the 128 bits from read register 111. Multiplexer 115 then supplies the 32 bit toggle instruction (MTDA0) as controlled by the two least significant digits of the MADDRESS signal (A0), wherein the 32 cells of module 103 at the location specified by the address MADRESS signal (A0) are then toggled as needed as per the 32 bit toggle instruction supplied via the MTDATA signal at CLK signal rising edge 6.

Multiplexer 115 then supplies the 32 bit toggle instruction (MTDA1) as controlled by the two least significant digits of the MADDRESS signal (A1), wherein the 32 cells of module 103 at the location specified by the address MADRESS signal (A1) are then toggled as needed as per the 32 bit toggle instruction supplied via MTDATA signal at CLK signal rising edge 7.

Multiplexer 115 then supplies the 32 bit toggle instruction (MTDA2) as controlled by the two least significant digits of the MADDRESS signal (A2), wherein the 32 cells of module 103 at the location specified by the address MADRESS signal (A2) are then toggled as needed as per the 32 bit toggle instruction supplied via MTDATA signal at CLK signal rising edge 8.

Multiplexer 115 then supplies the 32 bit toggle instruction (MTDA3) as controlled by the two least significant digits of the MADDRESS signal (A3), wherein the 32 cells of module 103 at the location specified by the address MADRESS signal (A3) are then toggled as needed as per the 32 bit toggle instruction supplied via MTDATA signal at CLK signal rising edge 9.

In the embodiment shown, ECC calculation circuit 123 calculates an 8 bit error correction code from the 128 bits (DA0, DA1, DA2, and DA3) supplied from multiplexer 125. Control logic 107 enables comparator 119 to compare the 8 bits from ECC calculation circuit 123 with the 8 bits from ECC register 113. The 8 bit output of comparator 119 is supplied as an 8 bit toggle instruction (MTEA) by signals MTECC at an error correction code address corresponding to the most significant digits of the MADDRESS signal (A3), wherein the 8 cells of module 103 storing the error correction code are then toggled as needed as per the 8 bit toggle instruction supplied via MTECC signal at CLK signal rising edge 9.

In a second embodiment, module 103 returns the requested data (DATARA and ECCRA) via signals MRDATA and corresponding error correction code via signals MRECC at CLK signal rising edge 3 to read register 111 and ECC register 113 respectively.

In this second embodiment, multiplexer 125 passes the first 32 bit word DA0, the second 32 bit word DA1 and 64 bits from ECC correction circuit 121 to comparator 117 and ECC calculation circuit 123. Comparator 117 compares the 128 bits with the 128 bits read from read register 111. Multiplexer 115 then supplies the 32 bit toggle instruction (MTDA0) as controlled by the two least significant digits of the MADDRESS signal (A0), wherein the 32 cells of module 103 at the location specified by the address MADRESS signal (A0) are then toggled as needed as per the 32 bit toggle instruction supplied via MTDATA signal at CLK signal rising edge 4.

In this second embodiment, ECC calculation circuit 123 calculates an 8 bit error correction code from the 128 bits supplied from multiplexer 125. However, because comparator 119 is not enabled at this time by control logic 107, the 8 bit error correction code is not compared with the contents of register 113.

In other variations of the second embodiment, instead of supplying 64 bits from ECC correction circuit 121 with DA0 from multiplexer 125, the 128 bits of register 127 may be supplied to comparator 117 and ECC calculation circuit 123.

Regarding the second embodiment, in a subsequent cycle to supplying DA0 and DA1 and 64 bits from ECC correction circuit 121, multiplexer 125 supplies DA0, DA1 and DA2 and 32 bits from ECC correction circuit 121 to comparator 117 and ECC calculation circuit 123. Comparator 117 compares those 128 bits with the 128 bits from read register 111. Multiplexer 115 then supplies the 32 bit toggle instruction (MTDA1) as controlled by the two least significant digits of the MADDRESS signal (A1), wherein the 32 cells of module 103 at the location specified by the address MADRESS signal (A1) are then toggled as needed as per the 32 bit toggle instruction supplied via MTDATA signal at CLK signal rising edge 5.

In the second embodiment, ECC calculation circuit 123 calculates an 8 bit error correction code from the 128 bits supplied from multiplexer 125. However, because comparator 119 is not enabled at this time by control logic 107, the 8 bit error correction code is not compared with the contents of register 113.

Further in the second embodiment, in a subsequent cycle to supplying DA0, DA1, DA2 and 32 bits from ECC correction circuit 121, multiplexer 125 supplies DA0, DA1, DA2, and DA3 to comparator 117 and ECC calculation circuit 123. Comparator 117 compares those 128 bits with the 128 bits from read register 111. Multiplexer 115 then supplies the 32 bit toggle instruction (MTDA2) as controlled by the two least significant digits of the MADDRESS signal (A2), wherein the 32 bits of module 103 at the location specified by the address MADRESS signal (A2) are then toggled as needed as per the 32 bit toggle instruction supplied via MTDATA signal at CLK signal rising edge 6.

In the second embodiment, ECC calculation circuit 123 calculates an 8 bit error correction code from the 128 bits supplied from multiplexer 125. However, because comparator 119 is not enabled at this time by control logic 107, the 8 bit error correction code is not compared with the contents of register 113.

In the second embodiment, in a subsequent cycle, multiplexer 115 then supplies the 32 bits toggle instruction (MTDA3) as controlled by the two least significant digits of the MADDRESS signal (A3), wherein the 32 cells of module 103 at the location specified by the address MADRESS signal (A3) are then toggled as needed as per the 32 bit toggle instruction supplied via MTDATA signal at CLK signal rising edge 7.

In the second embodiment, ECC calculation circuit 123 calculates an 8 bit error correction code from the 128 bits (DA0, DA1, DA2, and DA3) supplied from multiplexer 125 at the CLK signal rising edge 7. Control logic 107 enables comparator 119 to compare the 8 bits from ECC calculation circuit 123 with the 8 bits from ECC register 113. The 8 bit output of comparator 119 is supplied as an 8 bit toggle instruction (MTEA) by signals MTECC at an error correction code address corresponding to the most significant digits of the MADDRESS signal (A3), wherein the 8 cells of module 103 storing error correction code are then toggled as needed as per the 8 bit toggle instruction supplied via MTECC signal at CLK signal rising edge 7.

Note that in the second embodiment, the toggle information for write data DA0 is supplied to module 103 before write data DA3 is clocked into write register 127.

Because multiple words are read from module 103 at single time and stored in a register, those multiple words can be compared with serially received words of a burst write. Accordingly, the time for performing a burst write may be reduced in that only one read cycle is performed per burst. If a read were required prior to each toggle corresponding to each data word, then the time for performing a write burst would increase significantly to accommodate a read for each word of the burst. Referring back to FIG. 2, the four 32 bit word burst is completed in 9 cycles. If a read were required for each word of a burst, then (assuming 3 cycles to read a word from module 103) the same burst cycle would take 18 cycles.

The circuit of FIG. 1 could also perform two word bursts where comparator 119 is enabled when the first and second words of the burst are supplied (along with 64 bits from circuit 121) to ECC calculation circuit 123. In the embodiment shown, higher than four 32 bit word bursts may be accomplished by use of the READY signal to signal a processor to hold in supplying data subsequent to the first four data words. Once the first four words are entered, the READY signal is asserted to receive the next four data words. However, other embodiments may include other circuitry or other techniques for handling bursts of greater than four words.

Other embodiments of circuitry 105 may have other configurations. For example, 128 bit comparator 117 and 128/32 multiplexer 115 could be replaced by a 32 bit comparator and two 128/32 multiplexers, where one of the multiplexers would be located at the output of read register 111 and the other at the output of multiplexer 125.

In the embodiments described, each burst is made of multiple data units of 32 bit words. In other embodiments, the data units of each burst may be of different sizes. For example, the unit size may be e.g. 4, 8, 16, 64, or 128 bits. In other embodiments, circuitry 105 writes data units of other widths to module 103. In some embodiments, the size of the data unit written to module 103 is equal to the number of data signals (data width) of the system bus. In other embodiments, the size of the data unit written to module 103 may be less than the width of the data bus, e.g. to save power in writing data to memory module 103, or greater than the width of the data bus.

In the embodiments described herein, the ratio of the bit size read from module 103 (128 bits wide) to bit size written to module 103 (32 bits) is 4 to 1. However, other embodiments may have other ratios.

In other embodiments, circuitry 105 would have the ability to read different widths of data during a data read. In some examples of such embodiments, read register 111 and ECC correction register may be of different widths e.g. 256 bits wide. With such embodiments, 256 bits would be read from module 103 at each time.

One embodiment includes a method of writing data to a toggle memory. The method includes reading in parallel a plurality of cells of a first number of a toggle memory to obtain read data and receiving a plurality of write data units. The first number is equal to or greater than a combined width of two write data units of the plurality of write data units. The method includes deriving a plurality of toggle instructions. The plurality of toggle instructions includes a first toggle instruction and a second toggle instruction. The deriving a plurality of toggle instructions includes comparing bits of the read data with bits of the plurality write data units. The method further includes toggling cells of the toggle memory as needed as per the first toggle instruction and toggling cells of the toggle memory as needed as per the second toggle instruction after the toggling cells of the toggle memory as needed as per the first toggle instruction.

Another embodiment includes a method of performing a write burst to a toggle memory. The method includes reading in parallel a plurality of cells of a first number of a toggle memory to obtain read data and receiving serially a plurality of write data units in a write burst. The first number is equal to or greater than a combined width of two write data units of the plurality of write data units. The method also includes deriving toggle instructions. The deriving toggle instructions includes comparing bits of the read data with bits of the write data units. The method further includes toggling cells of the toggle memory as needed as per the toggle instructions.

In another embodiment, a system includes a toggle memory module and a read circuit for reading in parallel a plurality of bits from the toggle memory module. The plurality of bits having a first width. The system also includes a write circuit for receiving a plurality of write data units for writing to the toggle memory module, a compare circuit for comparing bits of the plurality of bits with bits of the plurality of write data units to generate a plurality of toggle instructions, and a toggle circuit for toggling a set of cells as needed as per a toggle instruction of the plurality of toggle instructions. The first width is at least two times the width of the set of cells.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of writing data to a toggle memory, the method comprising:
   reading in parallel a plurality of cells of a first number of a toggle memory to obtain read data;
   receiving a plurality of write data units, wherein the first number is equal to or greater than a combined width of two write data units of the plurality of write data units;
   deriving a plurality of toggle instructions, wherein the plurality of toggle instructions includes a first toggle instruction and a second toggle instruction, wherein the deriving a plurality of toggle instructions includes comparing bits of the read data with bits of the plurality of write data units;
   toggling cells of the toggle memory as needed as per the first toggle instruction;
   toggling cells of the toggle memory as needed as per the second toggle instruction after the toggling cells of the toggle memory as needed as per the first toggle instruction.

2. The method of claim 1 wherein:
the deriving a first toggle instruction includes comparing a first set of bits of the read data with a first write data unit of the plurality of write data units;
the deriving the second toggle instruction includes comparing a second set of bits of the read data with a second write data unit of the plurality of write data units.

3. The method of claim 2 wherein:
the first set of bits is read from a first set of cells of the plurality of cells;
toggling cells of the toggle memory as needed as per the first toggle instruction includes toggling the first set of cells as needed as per the first toggle instruction;
the second set of bits is read from a second set of cells of the plurality of cells;
toggling cells of the toggle memory as needed as per the second toggle instruction includes toggling the second set of cells as needed as per the second toggle instruction.

4. The method of claim 1 wherein:
the plurality of cells includes a first set of cells and a second set of cells;
the toggling cells of the toggle memory as needed as per the first toggle instruction includes toggling the first set of cells as needed as per the first toggle instruction;
the toggling cells of the toggle memory as needed as per the second toggle instruction as needed includes toggling the second set of cells as needed as per the second toggle instruction.

5. The method of claim 4 wherein the first set of cells and the second set of cells are each defined by a unique address.

6. The method of claim 1 wherein the plurality of toggle instructions includes a third toggle instruction and a fourth toggle instruction, the method further comprising:
toggling cells of the toggle memory as needed as per the third toggle instruction after the toggling cells of the toggle memory as needed as per the second toggle instruction;
toggling cells of the toggle memory as needed as per the fourth toggle instruction after the toggling cells of the toggle memory as needed as per the third toggle instruction.

7. The method of claim 6 wherein:
the plurality of cells includes a first set of cells, a second set of cells, a third set of cells, and a fourth set of cells;
the toggling cells of the toggle memory as needed as per the first toggle instruction includes toggling the first set of cells as needed as per the first toggle instruction;
the toggling cells of the toggle memory as needed as per the second toggle instruction includes toggling the second set of cells as needed as per the second toggle instruction;
the toggling cells of the toggle memory as needed as per the third toggle instruction includes toggling the third set of cells as needed as per the third toggle instruction;

the toggling cells of the toggle memory as needed as per the fourth toggle instruction includes toggling the fourth set of cells as needed as per the fourth toggle instruction.

8. The method of claim 1 wherein the toggle memory is coupled to a system bus having a data width and the plurality of write data units is received via the system bus, and wherein the first number is greater than or equal to twice the data width.

9. The method of claim 1 further comprising:
deriving an error correction code based on the plurality of write data units;
writing the error correction code to the toggle memory.

10. The method of claim 9 wherein the writing the error correction code includes:
deriving a error correction code toggle instruction, wherein the deriving an error correction code toggle instruction includes comparing the error correction code with bits read from a group of cells in the toggle memory;
toggling the group of cells in the memory as needed as per the error correction code toggle instruction.

11. The method of claim 10 wherein the plurality of cells includes the group of cells.

12. The method of claim 10 wherein at least some of the plurality of write data units are to be written to a location of cells in the toggle memory, wherein the group of cells in the toggle memory are toggled as needed as per the error correction code toggle instruction corresponding to the location of cells in the toggle memory.

13. The method of claim 1 wherein the second toggle instruction is derived after the first toggle instruction.

14. The method of claim 1 wherein the toggling cells of the toggle memory as needed as per the first toggle instruction occurs during a deriving of the second toggle instruction.

15. The method of claim 1 wherein the toggle memory is characterized as a magneto resistive random access memory.

16. The method of claim 1 wherein the receiving the plurality of write data units includes serially receiving the plurality of write data units.

17. A method of performing a write burst to a toggle memory, the method comprising:
reading in parallel a plurality of cells of a first number of a toggle memory to obtain read data;
receiving serially a plurality of write data units in a write burst, wherein the first number is equal to or greater than a combined width of two write data units of the plurality of write data units;
deriving toggle instructions, wherein the deriving toggle instructions includes comparing bits of the read data with bits of the write data units;
toggling cells of the toggle memory as needed as per the toggle instructions.

18. The method of claim 17 wherein:
the read data includes a plurality of data units,
the deriving includes deriving a first toggle instruction, wherein deriving the first toggle instruction includes comparing bits of a first data unit of the plurality of data units with a first write data unit of the plurality of write data units;
the deriving includes deriving a second toggle instruction, wherein deriving the second toggle instruction includes comparing bits of a second data unit of the plurality of data units with a second write data unit of the plurality of write data units;
the first data unit was read from a first set of cells of the plurality of cells;
the toggling the cells includes toggling the first set of cells as needed as per the first toggle instruction;
the second data unit was read from a second set of cells of the plurality of cells;
the toggling the cells includes toggling the second set of cells as needed as per the second toggle instruction.

19. The method of claim 17 further comprising:
deriving an error correction code based on the plurality of write data units;
writing the error correction code to the toggle memory.

20. A system, comprising:
a toggle memory module;
a read circuit for reading in parallel a plurality of bits from the toggle memory module, the plurality of bits having a first width;
a write circuit for receiving a plurality of write data units for writing to the toggle memory module;
a compare circuit for comparing bits of the plurality of bits with bits of the plurality of write data units to generate a plurality of toggle instructions; and
a toggle circuit for toggling a set of cells as needed as per a toggle instruction of the plurality of toggle instructions, wherein the first width is at least two times the width of the set of cells.

21. The system of claim 20 further comprising:
an error correction code calculation circuit for calculating an error correction code based on received write data; and
a compare circuit for deriving an error correction code toggle instruction based on the error correction code;
an error correction code write circuit for toggling cells of the toggle memory module as needed as per the toggle instruction.

22. The system of claim 20 wherein the toggle memory module is characterized as an magneto resistive random access memory.

* * * * *